(12) United States Patent
Miller et al.

(10) Patent No.: US 8,139,367 B2
(45) Date of Patent: Mar. 20, 2012

(54) TORSION SPRING MECHANISM SUPPORTIVE OF A FLEXIBLE PRINTED CIRCUIT

(75) Inventors: Scott L. Miller, Chicago, IL (US); Michael J. Lombardi, Mundelein, IL (US); Daniel M. Wodka, Chicago, IL (US); Frank H. Stone, Waukegan, IL (US)

(73) Assignee: Motorola Mobility, Inc., Libertyville, IL (US)

( * ) Notice: Subject to any disclaimer, the term of this patent is extended or adjusted under 35 U.S.C. 154(b) by 567 days.

(21) Appl. No.: 12/237,970

(22) Filed: Sep. 25, 2008

(65) Prior Publication Data

US 2010/0073890 A1    Mar. 25, 2010

(51) Int. Cl.
*H05K 5/02* (2006.01)
(52) U.S. Cl. .......... 361/759; 361/752; 379/428.02; 379/433.01; 455/572; 455/575.1; 455/575.4
(58) Field of Classification Search .......... 361/759, 361/826; 455/575.4; 379/428.01, 428.02, 379/428.03, 433.01, 433.12, 433.13
See application file for complete search history.

(56) References Cited

U.S. PATENT DOCUMENTS

| | | | |
|---|---|---|---|
| 4,807,079 A | | 2/1989 | Takahashi |
| 5,878,012 A | | 3/1999 | Watanabe et al. |
| 6,320,835 B1 | | 11/2001 | Kamei |
| 6,331,850 B1 | | 12/2001 | Olodort et al. |
| 6,659,927 B2 | | 12/2003 | Myers et al. |
| 6,822,871 B2 | | 11/2004 | Lee et al. |
| 6,924,989 B2 | * | 8/2005 | Hall .............................. 361/826 |
| 6,934,568 B2 | | 8/2005 | Charlier et al. |
| 6,947,778 B2 | | 9/2005 | Tsai |
| 6,973,186 B2 | | 12/2005 | Shin |
| 6,975,889 B2 | | 12/2005 | Chen et al. |
| 7,102,881 B2 | | 9/2006 | Park et al. |
| 7,184,806 B2 | | 2/2007 | Bae |
| 7,189,924 B1 | * | 3/2007 | Popescu et al. ................. 174/69 |
| 7,231,039 B2 | * | 6/2007 | Gronroos et al. ........ 379/428.02 |

(Continued)

FOREIGN PATENT DOCUMENTS

EP    1150476 B1    1/2005

(Continued)

OTHER PUBLICATIONS

PCT Search Report and Written Opinion, PCT/US2009/055585, dated Apr. 27, 2010, 10 pages.

*Primary Examiner* — Timothy Thompson
*Assistant Examiner* — Hiram E Gonzalez
(74) *Attorney, Agent, or Firm* — Gary J. Cunningham

(57) ABSTRACT

Disclosed is a torsion spring mechanism that supports and guides a flexible printed circuit for use in an electronic device with a sliding motion. The spring mechanism includes a first segment and a second segment that are joined by a torsion spring. The torsion spring has a predetermined spring constant and is capable of exerting a force. When the force of the torsion spring is unreleased the sliding housing is closed and when the force of the torsion spring is released the sliding housing is opened. An electrically conducting flexible printed circuit is at least partially supported by both the first and second segments while freely traversing the torsion spring length with an unsupported portion enough to provide adequate movement of the flexible printed circuit about the torsion spring length. In this way, a spring compartment within the device being approximately 5 millimeters in depth may support and protect the unidirectional torsion spring mechanism and flexible printed circuit.

20 Claims, 4 Drawing Sheets

U.S. PATENT DOCUMENTS

| | | |
|---|---|---|
| 7,319,892 B2 | 1/2008 | Kato |
| 7,367,116 B2 * | 5/2008 | Yoshino et al. .................. 29/830 |
| 7,599,723 B2 * | 10/2009 | Lee et al. .................... 455/575.4 |
| 7,636,437 B2 * | 12/2009 | Gronroos et al. ........ 379/428.02 |
| 2007/0270193 A1 | 11/2007 | Hsieh |

FOREIGN PATENT DOCUMENTS

| | | |
|---|---|---|
| KR | 10-2005-0066670 A | 6/2005 |
| KR | 10-2005-0120386 A | 12/2005 |
| KR | 10-2006-0102258 A | 9/2006 |
| KR | 10-2008-0057032 A | 6/2008 |

* cited by examiner

TORSION SPRING MECHANISM SUPPORTIVE OF A FLEXIBLE PRINTED CIRCUIT

FIELD

Disclosed is a torsion spring mechanism that may be used in an electronic sliding device, and more particularly a spring mechanism that supports and guides a flexible printed circuit throughout the range of motion of the sliding device.

BACKGROUND

The makers of mobile communication devices, including those of cellular telephones, are increasingly adding functionality to their devices. While there is a trend toward the inclusion of more features and improvements for current features, there is also a trend toward smaller mobile communication devices. As mobile communication device technology has continued to improve, the devices have become increasingly smaller. Fewer and/or smaller hardware and software components are therefore desirable when adding new features and making improvements to the current features in the smaller devices. Fewer hardware components may provide a cost benefit to the consumer.

Mobile communication device manufacturers continue to improve device form factors. Reasons to improve a form factor may include that the makers of mobile communication devices are increasingly adding functionality to their devices. Improvements to form factors may be created to add and/or improve features while maintaining or decreasing the size of a device. Ergonomics oftentimes play an important role in form factor development. For example, mobile communication devices form factors such as the candy bar form factor, the clam shell form factor, and the slider phone form factor are well known for their ease of use and stability.

In a slider form factor, two housings are nested in a closed position. The transceiver housing is the lower housing and the display housing is the upper housing. In opening, the transceiver housing linearly travels to reveal its keypad module. Different mechanisms are used to assist the relative motion of the two independent housings. Additionally, the electronics of the housings are connected by a flexible printed circuit configuration. In most slider devices, the flexible printed circuit has a rolling motion when the device is opened or closed which restricts the allowable construction of the circuit to a single electrically conductive layer. To achieve a desirably thin slider form factor while designing for robustness of the electronics and sturdiness of the linear motion of the slider is difficult.

DETAILED DESCRIPTION

Figure 1:
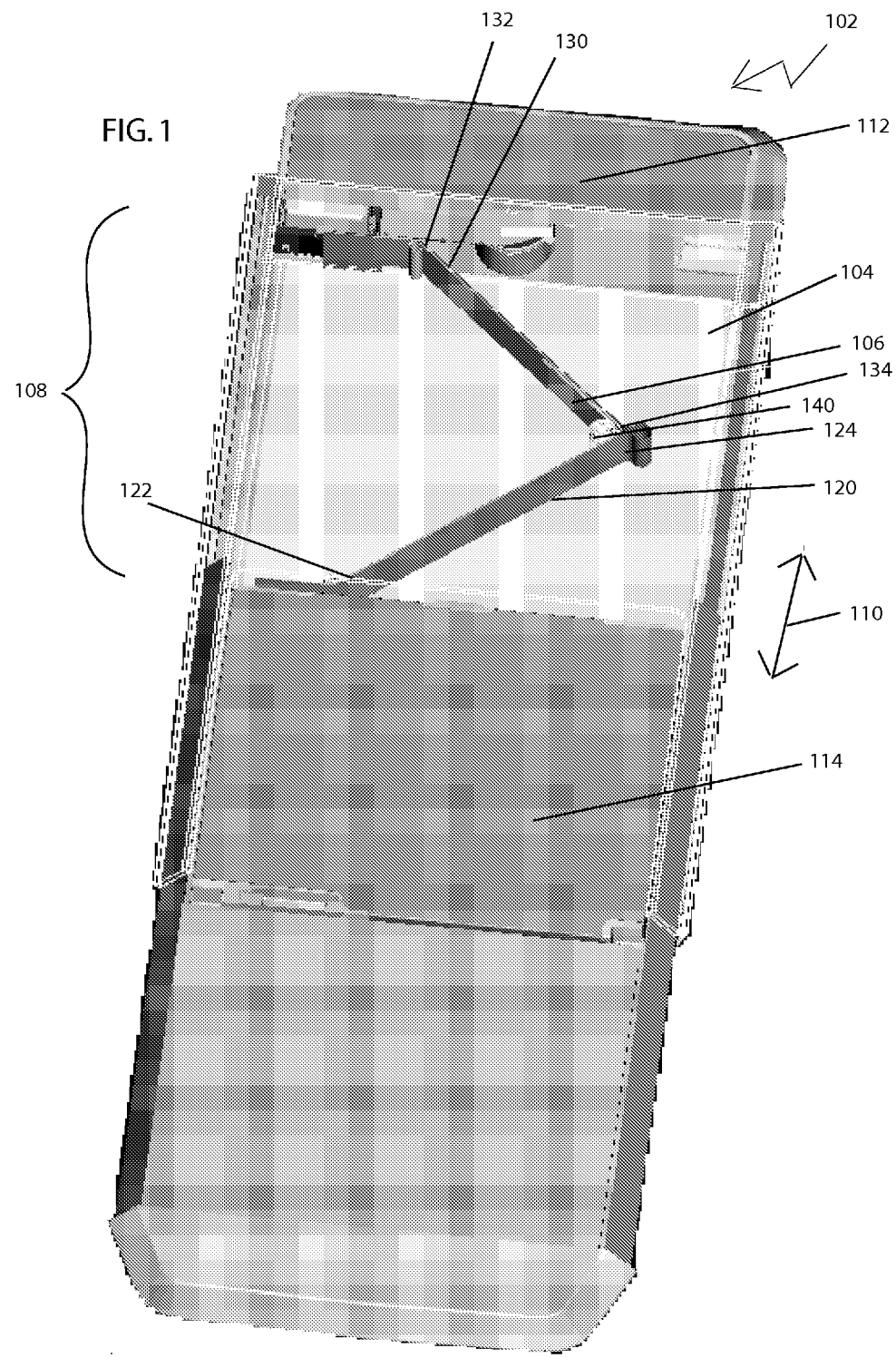
FIG. 1 depicts of the back side of an embodiment of a slider form factor mobile communication device with the spring compartment open to show the disclosed spring mechanism in an open position where the force of the torsion spring has been released.

Disclosed is a unidirectional torsion spring mechanism that supports and guides a flexible printed circuit for use in an electronic sliding device. The spring mechanism includes a first segment and a second segment that are joined by a torsion spring. The torsion spring has a predetermined spring constant and is capable of exerting a force. When the force of the torsion spring is unreleased the slider housing is in the closed position and when the force of the torsion spring is released the slider housing is opened. An electrically conducting flexible printed circuit is at least partially supported by both the first and second segments while freely traversing the torsion spring length with an unsupported portion enough to provide adequate movement of the flexible printed circuit about the torsion spring length. In this way, a spring compartment of the device housing being approximately 5 millimeters in depth may support the unidirectional torsion spring mechanism.

The disclosed spring mechanism includes a first segment having a first terminal end and a first coupling end and a second segment having a second terminal end and a second coupling end. The first coupling end and the second coupling end are coupled by a torsion spring having a predetermined spring constant and capable of exerting a force. The first terminal end and the second terminal end are configured to be adjacent when the force of the torsion spring is unreleased and are configured to be separated when the force of the torsion spring is released.

An electrically conducting flexible printed circuit having a circuit length at least partially supported by both the first segment and the second segment wherein the flexible printed circuit freely traverses the torsion spring length with an unsupported portion of the circuit length enough to provide adequate movement of the flexible printed circuit about the torsion spring length.

The spring mechanism may be supported by a housing, wherein the first terminal end includes a first pivot member attachable to the housing and wherein the second terminal end includes a second pivot member attachable to the housing. In this way, the spring compartment of the device housing may support the first segment having a first height; and the second segment having a second height, each of approximately 5 millimeters.

Several layers of flexible printed circuit may be robustly incorporated into the spring mechanism since a flexible printed circuit freely traverses the torsion spring length with an unsupported portion of the circuit length enough to provide adequate movement of the flexible printed circuit about the torsion spring length. The disclosed spring mechanism in combination with the flexible printed circuit is able to provide a large amount of linear travel while also supporting and guiding the electrical circuit. The torsion spring action upon opening the slider device may be predetermined by selection of a spring constant value. The force required to close the device manually is also dependent on this selection of spring constant. The disclosed spring mechanism, in this way, may be quite compact, having a height of approximately 5 millimeters, but a closed thickness of about 3 millimeters. This provides a means through which to add minimal length to the device while adding little in the way of thickness to the device.

The instant disclosure is provided to explain in an enabling fashion the best modes of making and using various embodiments in accordance with the present invention. The disclosure is further offered to enhance an understanding and appreciation for the invention principles and advantages thereof, rather than to limit in any manner the invention. While the preferred embodiments of the invention are illustrated and described here, it is clear that the invention is not so limited. Numerous modifications, changes, variations, substitutions, and equivalents will occur to those skilled in the art having the benefit of this disclosure without departing from the spirit and scope of the present invention as defined by the following claims.

It is understood that the use of relational terms, if any, such as first and second, up and down, and the like are used solely to distinguish one from another entity or action without necessarily requiring or implying any actual such relationship or order between such entities or actions.

FIG. 1 depicts of the back side of an embodiment of a slider form factor mobile communication device 102 with the spring compartment 104 open to show the disclosed spring mechanism 106 in an open position 108 where the force of the torsion spring has been released. The spring mechanism 106 is positioned in a plane perpendicular to the slide motion indicated by arrow 110 of the slider form factor, between the first and the second housing sections, such being the display housing 112 and the transceiver housing 114. The spring mechanism 106 is supported by the housing which provides the compartment 104 having a depth to contain the spring mechanism 106, wherein the spring mechanism 106 has a height and wherein dimensions of the height of the spring mechanism 106 is substantially equal to dimensions of the depth of the compartment 104. The disclosed spring mechanism 106, may have a height of approximately 5 millimeters, enabling the use of multiple coils in the torsion spring design.

The spring mechanism 106 includes a first segment 120 having a first terminal end 122 and a first coupling end 124 and a second segment 130 having a second terminal end 132 and a second coupling end 134. The first coupling end 124 and the second coupling end 134 are coupled by a torsion spring 140 having a predetermined spring constant and capable of exerting a force. FIG. 1 depicts the first terminal end 122 and the second terminal end 134 separated when the force of the torsion spring 140 is released so that the mobile device 102 is in an open position 108. In one embodiment, the first segment 120 and second segment 130 are formed of a folded sheet of spring steel, wherein the torsional spring 140 force is produced by a fold in the spring steel. In another embodiment, the torsion spring 140 is a multiple coil torsion spring. It is understood that any manner in which to form the spring mechanism 106 is within the scope of this discussion.

The spring compartment 104 is open to show the disclosed spring mechanism 106 in an open position 108. The spring mechanism 106 is positioned in a plane perpendicular to the slide motion indicated by arrow 110 within the spring compartment 104. In one embodiment, when the force of the torsion spring 140 is released the first terminal end 120 and the second terminal end 130 are separated by approximately 40 millimeters, which may be a suitable distance for a standard sized slider form factor mobile communication device. The first housing section, that is the transceiver housing 114 telescopically slides within the second housing section, that is the display housing 112 in the direction of the arrow 110. The first housing section and the second housing section, as depicted in FIG. 1 are configured to be in an open position relative to each other when force of the torsion spring is released. As will be discussed below, the first housing section and second housing sections are configured to be in a closed position relative to each other when force of the torsion spring is unreleased. It is understood that the spring mechanism 106 may be useful in any type of sliding device, and the discussion of the same with respect to a mobile communication device slider form factor is for illustrative purposes.

Figure 2:
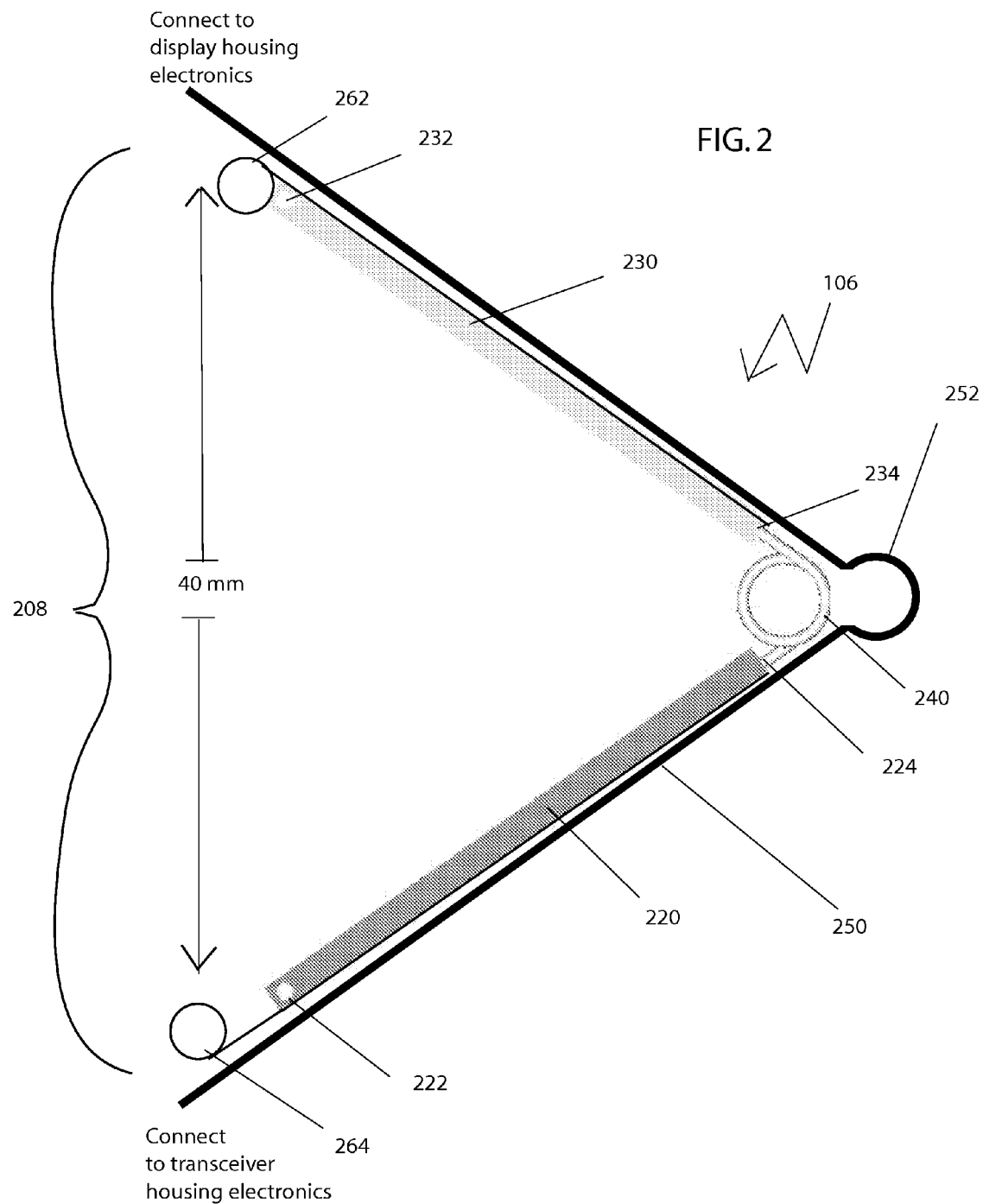
FIG. 2 depicts the disclosed spring mechanism in an open position when the force of the torsion spring has been released in more detail.

FIG. 2 depicts the disclosed spring mechanism 106 in an open position 208 when the force of the torsion spring 240 has been released in more detail. As discussed above, the spring mechanism 106 includes a first segment 220 having a first terminal end 222 and a first coupling end 224 and a second segment 230 having a second terminal end 232 and a second coupling end 234. The first coupling end 224 and the second coupling end 234 are coupled by a torsion spring 240 having a predetermined spring constant and capable of exerting a force. In general it can be noted that the first segment 220, the second segment 230 and the length of the torsion spring 240 are linearly aligned. Also, a flexible printed circuit may have a width equal to that of the segments so that the flexible printed circuit is perpendicular to the front of the device. Moreover, during opening and closing of the spring mechanism, the perpendicular orientation is maintained by the first and second mechanism segments. In one embodiment, when the force of the torsion spring 140 is released the first terminal end 220 and the second terminal end 230 are separated by approximately 40 millimeters, which may be a suitable distance for a standard sized slider form factor mobile communication device.

It is better illustrated in FIG. 2 than in FIG. 1 that there is an electrically conducting flexible printed circuit 250 having a circuit length at least partially supported by both the first segment 220 and the second segment 230. The circuit may be supported by the mechanism 106 by a bonding substance or in any other suitable manner. A portion 252 of the flexible printed circuit freely traverses the torsion spring length 240 with an unsupported portion of the circuit length enough to provide adequate movement of the flexible printed circuit about the torsion spring 240 length. In one embodiment the radius of the freely traversing circuit portion 252 may be 2 mm. It is understood that the flexible printed circuit may include a plurality of layers. The disclosed spring mechanism 206 in combination with the flexible printed circuit 250 is able to provide a large amount of linear travel while also guiding the electrical circuit 250.

Also better illustrated in FIG. 2 than in FIG. 1 is that the spring mechanism 106 includes a first terminal end 222 and a first pivot member 262 attachable to a static object and wherein the second terminal end 232 includes a second pivot member 264 attachable to a second, moveable object. FIG. 1 depicts that the first terminal end 122 (see FIG. 1) and the second terminal end 132 are attached to the housing, and more particularly, the inside of the spring compartment 104. The first pivot member 262 and the second pivot member 264 allow the spring mechanism to pivot at the terminal ends during the opening motion and the closing motion of the slider form factor device.

Figure 3:
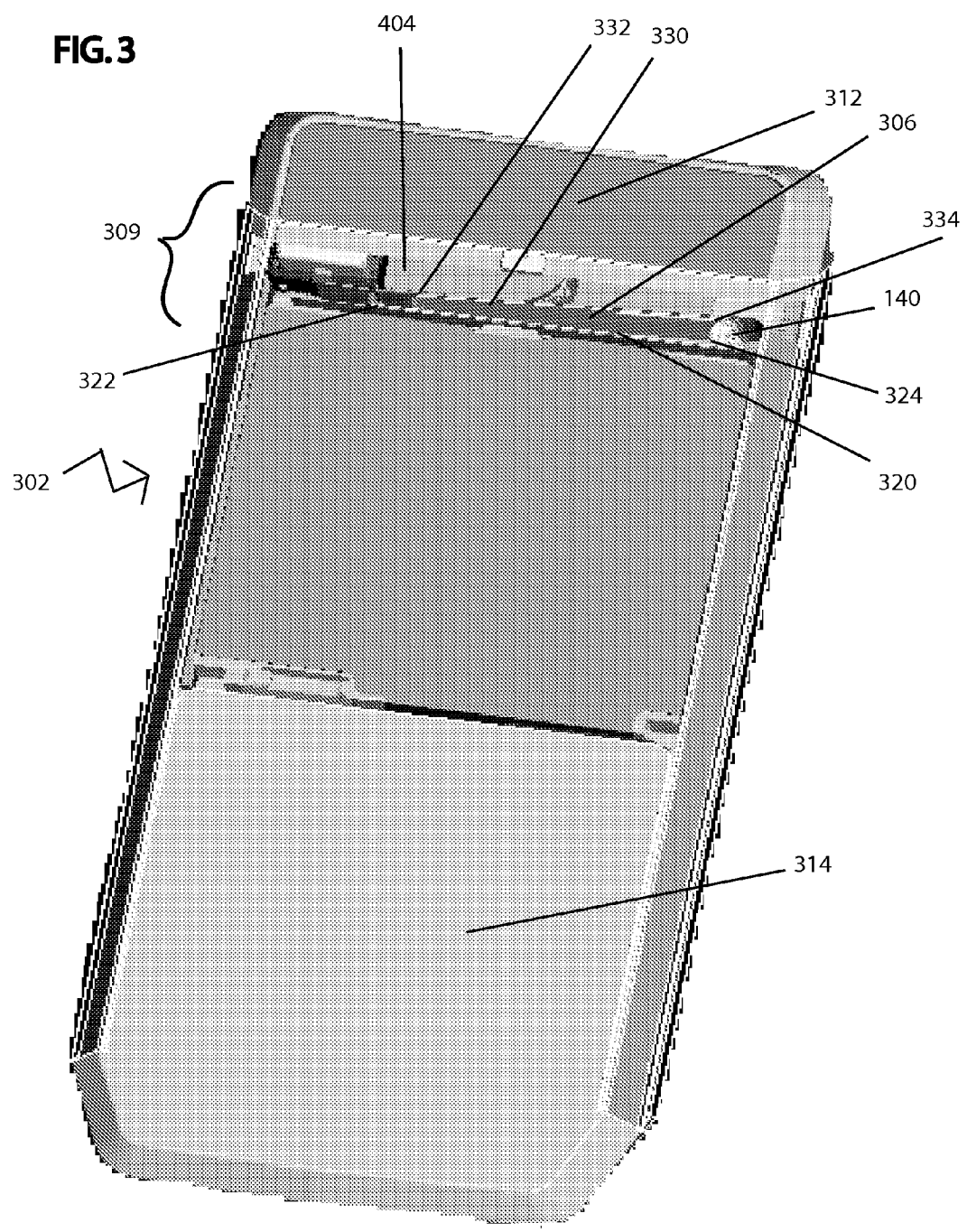
FIG. 3 depicts the back side of an embodiment of a slider form factor mobile communication device with the spring compartment open to show the disclosed spring mechanism in a folded or closed position where the force of the torsion spring is unreleased.

FIG. 3 depicts the back side of an embodiment of a slider form factor mobile communication device 302 with the spring compartment 404 open to show the disclosed spring mechanism 306 in a folded or closed position 309 when the force of the torsion spring 306 is unreleased. As discussed before, the spring mechanism 306 includes a first segment 320 having a first terminal end 322 and a first coupling end 324 and a second segment 330 having a second terminal end 332 and a second coupling end 334. The first coupling end 324 and the second coupling end 334 are coupled by a torsion spring 340 having a predetermined spring constant and capable of exerting a force. As shown in FIG. 3, the spring mechanism 306 may close to be quite thin, beneficially adding little in the way of length or thickness to the device 302.

The spring compartment 404 is open to show the disclosed spring mechanism 106 in a closed position 309. The spring mechanism 306 is positioned in a plane perpendicular to the slide motion within the spring compartment 404. In one embodiment, when the force of the torsion spring 340 is unreleased the first terminal end 320 and the second terminal end 330 are adjacent. The first housing section, that is the transceiver housing 314 has telescopically slid within the second housing section, that is the display housing 312. The first housing section and the second housing section, as depicted in FIG. 3 are configured to be in an closed position relative to each other when force of the torsion spring 306 is unreleased. To release the torsion spring 306, a latch or push button release may be activated.

Figure 4:
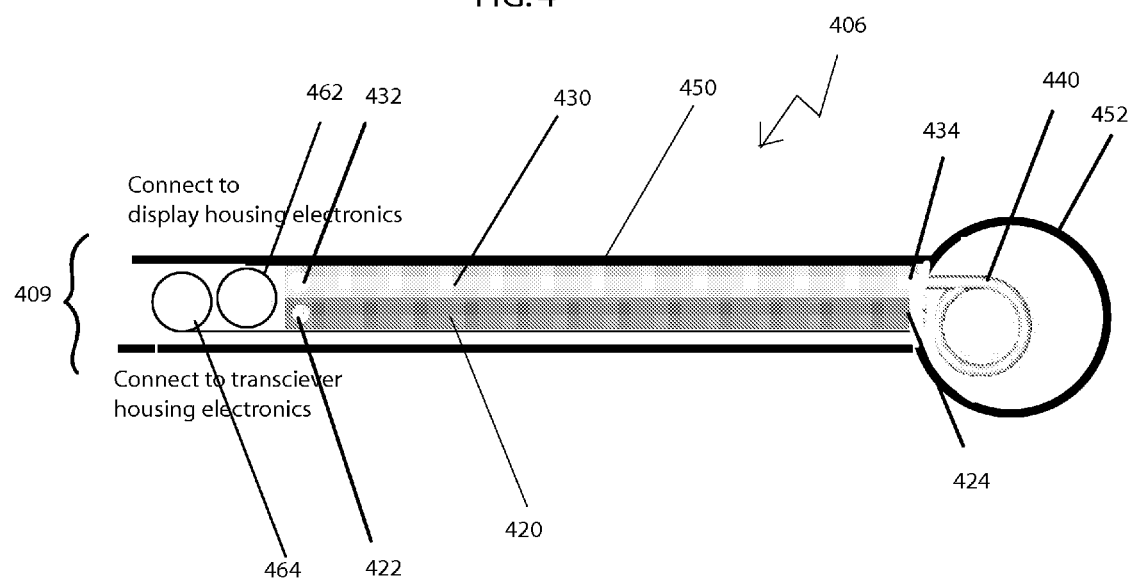
FIG. 4 depicts the disclosed spring mechanism in a closed position when the force of the torsion spring is unreleased in more detail.

FIG. 4 depicts the disclosed spring mechanism 406 in a closed position 409 when the force of the torsion spring 440 is unreleased in more detail. As discussed above, the spring mechanism 406 includes a first segment 420 having a first terminal end 422 and a first coupling end 424 and a second segment 430 having a second terminal end 432 and a second coupling end 434. The first coupling end 424 and the second coupling end 434 are coupled by a torsion spring 440 having a predetermined spring constant and capable of exerting a force.

It is better illustrated in FIG. 4 than in FIG. 3 that there is an electrically conducting flexible printed circuit 450 having a circuit length at least partially supported by both the first segment 420 and the second segment 430. A portion 452 of the flexible printed circuit freely traverses the torsion spring length 440 with an unsupported portion of the circuit length enough to provide adequate movement of the flexible printed circuit about the torsion spring 440 length. In one embodiment the radius of the freely traversing circuit portion 452 may be 2 mm. It is understood that the flexible printed circuit may include a plurality of layers. The disclosed spring mechanism 406 in combination with the flexible printed circuit 450 is able to provide a large of amount of linear travel while also guiding the electrical circuit 450.

Also better illustrated in FIG. 4 than in FIG. 3 is that the spring mechanism 406 includes a first terminal end 422 and a first pivot member 462 attachable to a static object and wherein the second terminal end 432 includes a second pivot member 464 attachable to a second, moveable object. FIG. 1 depicts that the first terminal end 122 (see FIG. 1) and the second terminal end 132 are attached to the housing, and more particularly, the inside of the spring compartment 104. The first pivot member 462 and the second pivot member 464 allow the spring mechanism to pivot at the terminal ends during the opening motion and the closing motion of the slider form factor device.

The first segment 420 has a first length, the second segment 430 has a second length and the first length is longer than the second length so that the pivot members 462 and 464 avoid each other allowing the spring mechanism 406 in its closed position to be more compact.

A method of utilizing a spring mechanism as described above in a slider form factor may include positioning the first terminal end and the second terminal end adjacently when the force of the torsion spring is unreleased so that the electrical flexible printed circuit is in a folded position and positioning the first terminal end and the second terminal end separately when the force of the torsion spring is released so that the electrical flexible printed circuit is an extended position. By releasing the force of the torsion spring by activating a force releasing mechanism, the housing portions may be separated. The device may be placed in the closed position by moving the first housing portion and the second housing portion together.

Several layers of flexible printed circuit may be robustly incorporated into the spring mechanism since a flexible printed circuit freely traverses the torsion spring length with an unsupported portion of the circuit length enough to provide adequate movement of the flexible printed circuit about the torsion spring length. The disclosed spring mechanism in combination with the flexible printed circuit is able to provide a large amount of linear travel while also supporting and guiding the electrical circuit. The torsion spring action upon opening the slider device may be predetermined by selection of a spring constant value. The force required to close the device manually is also dependent on this selection of spring constant. The disclosed spring mechanism, in this way, may be quite thin, having a height of approximately 5 millimeters, beneficially adding little in the way of thickness to the device.

This disclosure is intended to explain how to fashion and use various embodiments in accordance with the technology rather than to limit the true, intended, and fair scope and spirit thereof. The foregoing description is not intended to be exhaustive or to be limited to the precise forms disclosed. Modifications or variations are possible in light of the above teachings. The embodiments were chosen and described to provide the best illustration of the principle of the described technology and its practical application, and to enable one of ordinary skill in the art to utilize the technology in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally and equitably entitled.

The invention claimed is:

1. A spring mechanism supported by a housing, comprising:
    a first segment having a first terminal end and a first coupling end;
    a second segment having a second terminal end and a second coupling end; wherein
    the first coupling end and the second coupling end are coupled by a torsion spring having a predetermined spring constant and capable of exerting a force; wherein:
    the first terminal end and the second terminal end are configured to be adjacent when the force of the torsion spring is unreleased; and
    the first terminal end and the second terminal end are configured to be separated when the force of the torsion spring is released; and
    an electrically conducting flexible printed circuit having a circuit length at least partially supported by and bonded to an outer portion of both the first segment and the second segment and the flexible printed circuit freely traverses a radius portion of the torsion spring length being unbonded, configured to provide adequate movement of the flexible printed circuit about the torsion spring length,
    the housing further comprises a first housing section and a second housing section such that the first housing section telescopically slides within the second housing section with the spring mechanism being placed between the first housing section and the second housing section.

2. The mechanism of claim 1, wherein:
the first segment has a first height;
the second segment has a second height;
wherein the first height and second height are approximately 5 millimeters.

3. The mechanism of claim 1, wherein the first segment and second segment are formed of a folded sheet of spring steel, and wherein the torsional spring force is produced by a fold in the spring steel.

4. The mechanism of claim 1, wherein the torsion spring is a multiple coil torsion spring.

5. The mechanism of claim 1, wherein the first terminal end and the second terminal end are separated by approximately 40 millimeters when the force of the torsion spring is released.

6. The mechanism of claim 1 wherein the first terminal end includes a first pivot member attachable to a static object and wherein the second terminal end includes a second pivot member attachable to a second, moveable object.

7. The mechanism of claim 1 wherein the first segment has a first length, the second segment has a second length and the first length is longer than the second length.

8. The mechanism of claim 1 wherein the first segment, the second segment and the length of the torsion spring are linearly aligned.

9. The mechanism of claim 1 wherein the flexible printed circuit includes multiple electrically conducting layers.

10. A spring mechanism supported by a housing, comprising:
a first segment having a first terminal end and a first coupling end;
a second segment having a second terminal end and a second coupling end; wherein
the first coupling end and the second coupling end are coupled by a torsion spring having a predetermined spring constant and capable of exerting a force; wherein:
the first terminal end and the second terminal end are configured to be adjacent when the force of the torsion spring is unreleased; and
the first terminal end and the second terminal end are configured to be separated when the force of the torsion spring is released; and
an electrically conducting flexible printed circuit having a circuit length at least partially supported by and bonded to an outer portion of both the first segment and the second segment and the flexible printed circuit freely traverses a radius portion of the torsion spring length being unbonded, configured to provide adequate movement of the flexible printed circuit about the torsion spring length;
wherein the first terminal end includes a first pivot member attachable to the housing and wherein the second terminal end includes a second pivot member attachable to the housing,
the housing further comprises a first housing section and a second housing section such that the first housing section telescopically slides within the second housing section with the spring mechanism being placed between the first housing section and the second housing section.

11. The mechanism of claim 10 wherein the first housing section and second housing sections are configured to be in a closed position relative to each other when force of the torsion spring is unreleased; and
wherein the first housing section and the second housing section are configured to be in an open position relative to each other when force of the torsion spring is released.

12. The mechanism of claim 10 wherein the housing provides a compartment having a depth to contain the spring mechanism, wherein the spring mechanism has a height and wherein dimensions of the height of the spring mechanism is substantially equal to dimensions of the depth of the compartment.

13. The mechanism of claim 10 wherein the housing is that of a mobile communication slider form factor.

14. The mechanism of claim 10, wherein the first segment and second segment are formed of a folded sheet of spring steel, and wherein the torsional spring force is produced by a fold in the spring steel.

15. The mechanism of claim 10, wherein the torsion spring is a multiple coil torsion spring.

16. The mechanism of claim 10, wherein the first terminal end and the second terminal end are separated by approximately 40 millimeters when the force of the torsion spring is released.

17. The mechanism of claim 10 wherein the first segment has a first length, the second segment has a second length and the first length is longer than the second length.

18. The mechanism of claim 10 wherein the flexible printed circuit includes multiple electrically conducting layers.

19. A method of utilizing a spring mechanism in a slider form factor having a first housing portion and a second housing portion, the spring mechanism including a first segment having a first terminal end and a first coupling end, a second segment having a second terminal end and a second coupling end and wherein the first coupling end and the second coupling end are coupled by a torsion spring having a torsion spring length and capable of exerting a force, and an electrically conducting flexible printed circuit having a circuit length at least partially supported by both the first segment and the second segment wherein the flexible printed circuit traverses the torsion spring length with a portion of the circuit length enough to provide play of the flexible printed circuit about the torsion spring length, the method comprising:
positioning the first terminal end and the second terminal end adjacently when the force of the torsion spring is unreleased so that the electrical flexible printed circuit is in a folded position;
positioning the first terminal end and the second terminal end separately when the force of the torsion spring is released so that the electrical flexible printed circuit is an extended position, wherein the first housing portion telescopically slides within the second housing portion, with the spring mechanism being placed between the first housing portion and the second housing portion; and
bonding the electrically conducting flexible printed circuit to an outer portion of both the first segment and the second segment, wherein the flexible printed circuit freely traverses a radius portion of the torsion spring length being unbonded.

20. The method of claim 19, wherein positioning the first terminal end and the second terminal end adjacently comprises:
moving the first housing portion and the second housing portion together.

* * * * *